United States Patent [19]
Burchfield

[11] Patent Number: 5,434,545
[45] Date of Patent: Jul. 18, 1995

[54] FULLY DIFFERENTIAL VOLTAGE CONTROLLED OSCILLATOR

[75] Inventor: Mark E. Burchfield, Austin, Tex.

[73] Assignee: Cyrix Corporation, Richardson, Tex.

[21] Appl. No.: 326,887

[22] Filed: Oct. 21, 1994

[51] Int. Cl.6 .......................... H03B 5/24; H03K 4/00; H03L 7/099

[52] U.S. Cl. .................................... 331/143; 331/1 A; 331/8; 331/111; 331/177 R; 327/101; 327/134; 327/293; 327/295

[58] Field of Search ..................... 331/1 R, 1 A, 8, 11, 331/143, 175, 177 R; 327/101, 131, 134, 135, 137, 140, 291, 293, 295

[56] References Cited

U.S. PATENT DOCUMENTS

| | | |
|---|---|---|
| 3,594,649 | 2/1969 | Rauch .................................. 327/101 |
| 4,498,020 | 2/1985 | Giolma et al. ........................ 327/101 |
| 4,692,717 | 9/1987 | Ouyang et al. ....................... 331/111 |
| 4,812,784 | 3/1989 | Chung et al. ...................... 331/113 R |
| 4,922,139 | 5/1990 | Giebel . |
| 4,987,387 | 1/1991 | Kennedy et al. .................... 331/1 A |
| 5,300,898 | 4/1994 | Chen et al. ............................. 331/57 |
| 5,341,113 | 8/1994 | Baron et al. ....................... 331/57 X |

Primary Examiner—David Mis
Attorney, Agent, or Firm—Andrew S. Viger; John L. Maxin

[57] ABSTRACT

A fully differential voltage controlled oscillator having a large common mode rejection ratio is disclosed with a first and a second phase detector disposed between the output of a differential comparator and the input of a differential triangle wave generator to insure 180 degree out of phase operation.

8 Claims, 6 Drawing Sheets

FULLY DIFFERENTIAL VOLTAGE CONTROLLED OSCILLATOR

BACKGROUND OF THE INVENTION

1. Field of the Invention

The invention relates generally to electronic oscillators, and more particularly to a fully differential voltage controlled oscillator.

2. Description of Related Art

Without limiting the scope of the invention, this background information is provided in the context of a specific problem to which the invention has application. Voltage controlled oscillators a.k.a. VCOs are ubiquitous, found in applications ranging from automobiles to microprocessors. The most common application for a VCO is in a phase locked loop, a.k.a. PLL. A PLL is commonly used to synthesize a high frequency clock signal from and synchronous to, a lower frequency reference signal.

In its most simplest form, a PLL comprises a VCO, a prescaler (divider), and a phase comparator (sometimes referred to as a frequency/phase discriminator). The output of the phase comparator drives the input of the VCO, typically through a low pass filter. The VCO output is then scaled through the prescaler and fed back to one input on the phase comparator. A second input on the phase comparator is coupled to a reference signal that the VCO output frequency tracks, scaled by an amount set by the prescaler.

In digital systems, power supply noise can have a dramatic effect on accuracy. For the most part, noise superimposed on the power supply is from the fast switching digital signals. This noise tends to be common mode thus is present on both rafts of the power supply. Accordingly, differential devices are typically used to cancel the unwanted common mode signals. Up until now however, digital systems employing VCOs have been either single-ended or did not truly have differential inputs and outputs operating substantially 180 degrees out of phase. Consequently, the common mode rejection ratio was marginal. Furthermore, prior art VCO approaches are not particularly adept at operating at reduced power supply voltages.

By way of illustration, U.S. Pat. No. 4,692,717, issued Sep., 8, 1987, entitled "Voltage Controlled Oscillator With High Speed Current Switching" discloses a single-ended VCO having a single capacitor (10) for filtering noise on the $V_{cc}$ power supply rail but not on the ground rail. Moreover, an active filter is employed for the loop filter making it difficult to operate at a reduced power supply voltage.

Similarly, U.S. Pat. No. 4,812,784, issued Mar. 14, 1989, entitled "Temperature Stable Voltage Controlled Oscillator With Super Linear Wide Frequency Range" discloses a VCO including capacitors $C_{1a}$, and $C_{1b}$, which provides, for purposes of power supply noise rejection, undesirable feedback into nodes A and B. Additionally, the design requires the so-called BiCMOS fabrication process, a combination of bipolar and CMOS technologies having its own drawbacks.

Accordingly, it can be seen that there is a need for a fully differential VCO capable of operating at a reduced power supply voltage and having a large common mode rejection ratio (CMF) that provides a superior power supply rejection ratio (PSRR).

SUMMARY OF THE INVENTION

To overcome the limitations in the prior art described above, and to overcome other limitations that will become apparent upon reading and understanding the present specification, the present invention discloses a fully differential VCO having a large common mode rejection ratio that provides a superior power supply rejection ratio and is capable of operating at a reduced power supply voltage. The VCO includes a triangle/sawtooth wave generator, a comparator, and a first and a second phase detector. The first and second phase detectors are coupled between the output of the comparator and the input to the triangle wave generator to insure substantial 180 degree out of phase operation.

A feature of the present invention is a large power supply rejection ratio (PSRR) due to its fully differential nature.

Another feature of the present invention is that only two nodes move with a limited voltage swing thus output jitter is improved with respect to power supply noise.

Yet another feature of the present invention is induced hysteresis to insure a minimum voltage swing on the output of the triangle wave generator at high currents.

These and various other objects, features, and advantages of novelty which characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a specific example of a VCO practiced in accordance with the present invention.

BRIEF DESCRIPTION OF THE DRAWINGS

Referring now to the drawings in which like reference numerals and letters indicate corresponding elements throughout the several views.

DESCRIPTION OF THE PREFERRED EMBODIMENT

Figure 1:
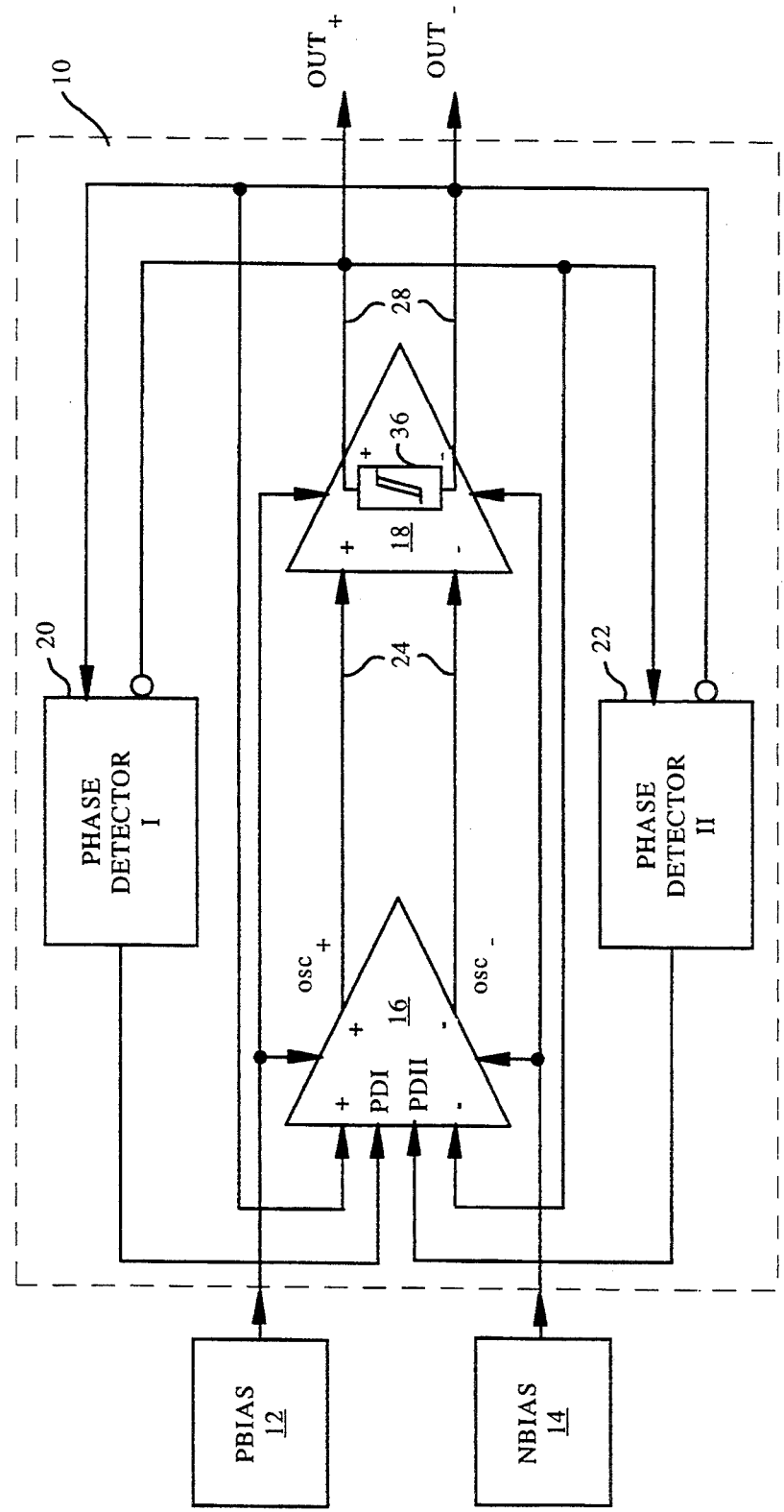
FIG. 1 is a block diagram of a voltage controlled oscillator practiced in accordance with the principles of the present invention.

Before describing in detail the particular improved voltage controlled oscillator, it should be noted that the invention resides primarily in a novel combination of conventional circuits and not m a particular detailed configuration thereof. Accordingly, in order not to obscure the disclosure with structural details which will be readily apparent to those skilled in the art having the benefit of the description herein, the structure, control and arrangement of these conventional circuits have been illustrated in the drawings by readily understandable block representations and schematic diagrams, showing and describing only those specific details that are pertinent to the present invention. Thus, the block diagram illustrations in the figures do not necessarily represent the mechanical arrangement of the exemplary system, but are primarily intended to illustrate the major structural components in a convenient functional grouping, wherein the present invention may be more readily understood. It is to be understood that other embodiments may be utilized and structural changes may be made without departing from the scope of the present invention.

The detailed description is organized as follows:
1. Exemplary Voltage Controlled Oscillator
1.1 Triangle/Sawtooth Waveform Generator
1.2 Comparator
1.3 Phase Detector
1.4 Hysteresis Latch
2. Conclusion This organizational outline, and the corresponding headings, are used in this Detailed Description for convenience of reference only. Detailed descriptions of conventional or known aspects of voltage controlled oscillators and of MOSFET operation are omitted so as to not obscure the description of the invention with unnecessary detail.

1. Exemplary Voltage Controlled Oscillator

Reference is now made to FIG. 1 which illustrates a block diagram of an exemplary differential voltage controlled oscillator 10, practiced in accordance with the principles of the present invention. Bias voltages from PBIAS generator 12 and NBIAS generator 14 are coupled to a triangle/sawtooth wave generator 16 and to a comparator 18. As explained in more detail hereinbelow, the PBIAS generator 12 and the NBIAS generator 14 alter the frequency of the oscillator 10 by biasing P-channel devices and N-channel devices in the triangle/sawtooth wave generator 16 and in the comparator 18. The exact configurations for PBIAS generator 12 and NBIAS generator 14 are not necessary for the understanding of the present invention. However, an exemplary source for PBIAS generator 12 and NBIAS generator 14 can be found in copending and commonly assigned U.S. patent application Ser. No. 08/327,070, filed Oct. 21, 1994, herein incorporated by reference.

Differential output (osc$_+$ and osc$_-$) 24 from triangle/sawtooth wave generator 16 is coupled into the differential input on comparator 18. Differential output (OUT$_+$ and OUT$_-$) 28 from comparator 18 is coupled to inputs on first phase detector 20 and is cross-coupled back (positive-to-negative, negative-to-positive) to the differential input on triangle/sawtooth wave generator 16. Differential output (OUT$_+$ and OUT$_-$) 28 is also cross-coupled (with respect to the first phase detector 20) to inputs on the second phase detector 22. Single-ended outputs from the first phase detector 20 and the second phase detector 22 which are substantially 180 degrees out of phase with respect to one another (PDI and PDII respectively), are coupled to inputs on the triangle/sawtooth wave generator 16.

Figure 2:
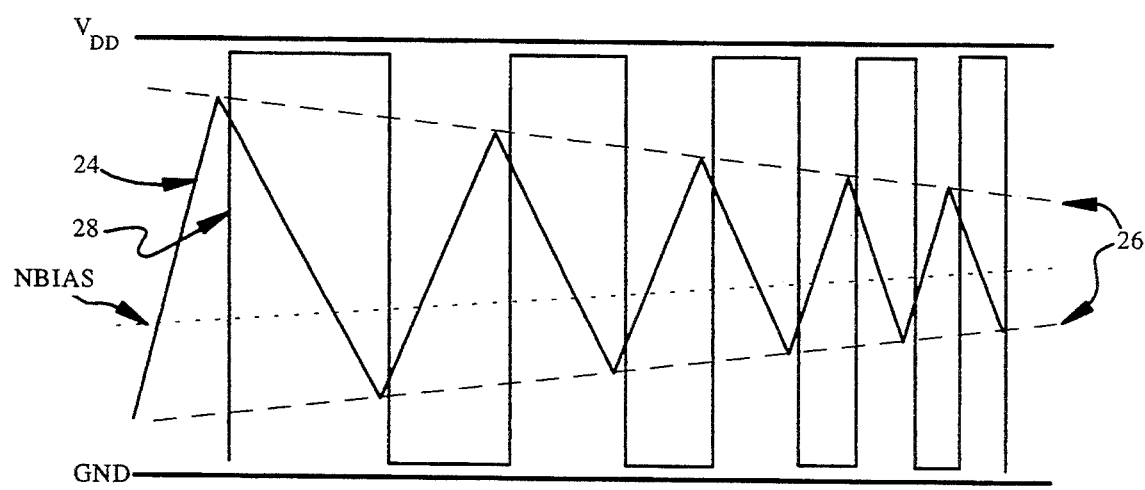
FIG. 2 is a diagram depicting exemplary waveforms produced in the voltage controlled oscillator of FIG. 1.

The function of FIG. 1 is best described with respect to the waveforms depicted in FIG. 2. It should noted that PBIAS is not depicted so as not to obscure the invention with detail and that the differential output 28 swings slightly below $V_{DD}$ and slightly above the ground power supply raft due to the on-resistance of MOSFET transistors described in more detail hereinbelow. Differential triangular output (osc$_+$ and osc$_-$) 24 oscillates between the voltage offset envelope 26 established by comparator 18. More specifically, as NBIAS increases or PBIAS decreases, the voltage offset envelope 26 reduces thus the necessary input voltage to induce switching is reduced. Consequently as NBIAS increases or PBIAS decreases, the slope of differential triangular output (osc$_+$ and osc$_-$) 24 increases thus the frequency of comparator differential output (OUT$_+$ and OUT$_-$) 28 increases.

1.1 Triangle/Sawtooth Waveform Generator

Figure 3:
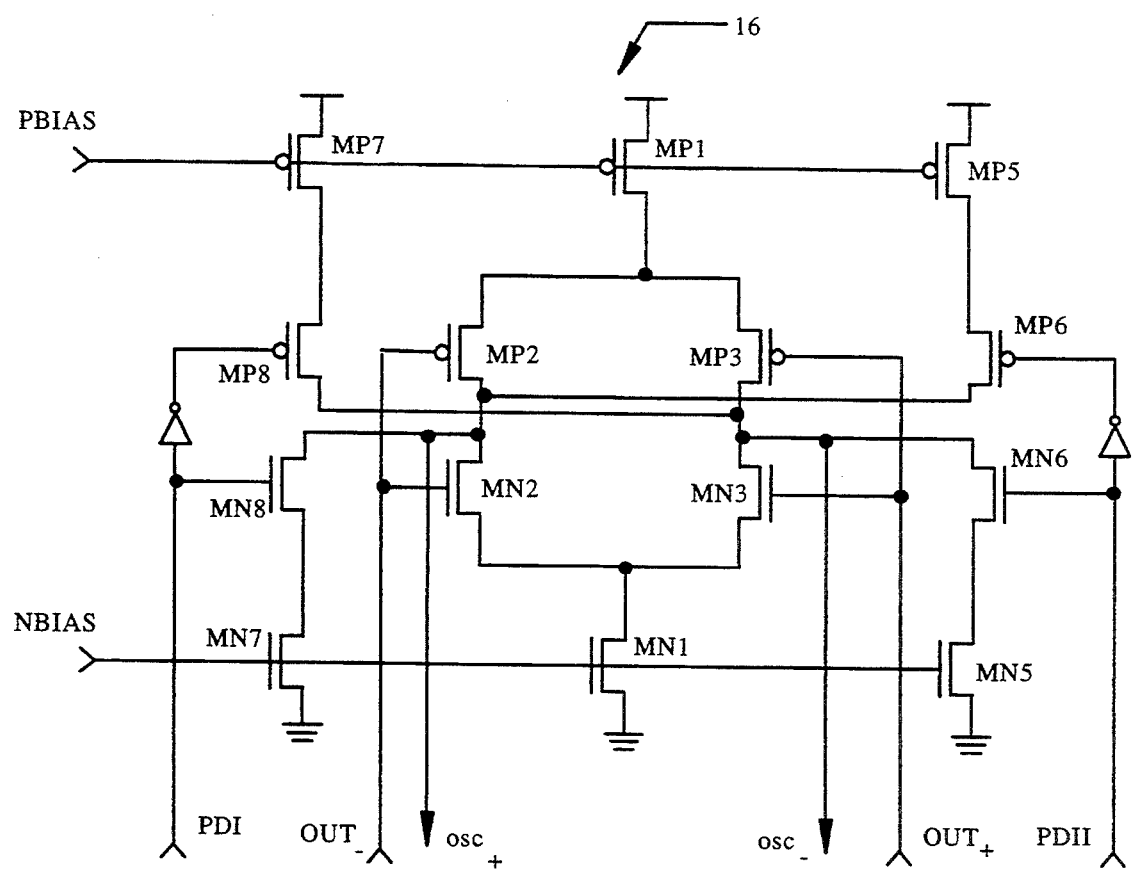
FIG. 3 is a schematic diagram of a preferred embodiment for the triangle/sawtooth wave generator depicted in FIG. 1.

Reference is now made to FIG. 3 which illustrates an exemplary embodiment for the triangle/sawtooth wave generator 16 depicted in FIG. 1. It should be noted that throughout the specification, P-channel and N-channel transistors are prefixed as MP and MN respectively. Transistors MP7, MP1, and MP5 have their sources coupled to $V_{DD}$. Transistors MN7, MN1, and MN5 have their sources coupled to ground. The drams of MP7 and MP5 are respectively coupled to the sources of MP8 and MP6. The drams of MN7 and MN5 are respectively coupled to the sources of MN8 and MN6.

The gates of transistors MN7, MN1, and MN5 are coupled to NBIAS while the gates of transistors MP7, MP1, and MP5 are coupled to PBIAS. Transistors MP2, MN2, MP3, and MN3 are coupled in complementary fashion to form art H-bridge with the commonly connected drains of MP2 and MN2 and the commonly connected drains of MP3 and MN3 forming output nodes for the differential triangular output (osc$_+$ and osc$_-$) 24. The drains of MN8 and MP6 are coupled to the drams of MP2 and MN2. The drams of MP8 and MN6 are coupled to the drains of MP3 and MN3. The gates of transistors MP2 and MN2 are coupled to OUT$_-$ on comparator 18 while the gates of transistors MP3 and MN3 are coupled to OUT$_+$ on comparator 18.

The sources of MP2 and MP3 are coupled to the drain of MP1. The sources of MN2 and MN3 are coupled to the dram of MN1. The channel length and width of transistors MP2, MN2, MP3, and MN3 are chosen such that their impedance is much lower than the impedance of MP1 and MN1. The output signal from the first phase detector 20 (PDI) is coupled to the gates of transistors MP8 and MN8 while the output signal from the second phase detector (PDII) is coupled to the gates of transistors MP6 and MN6.

1.2 Comparator

Figure 4:
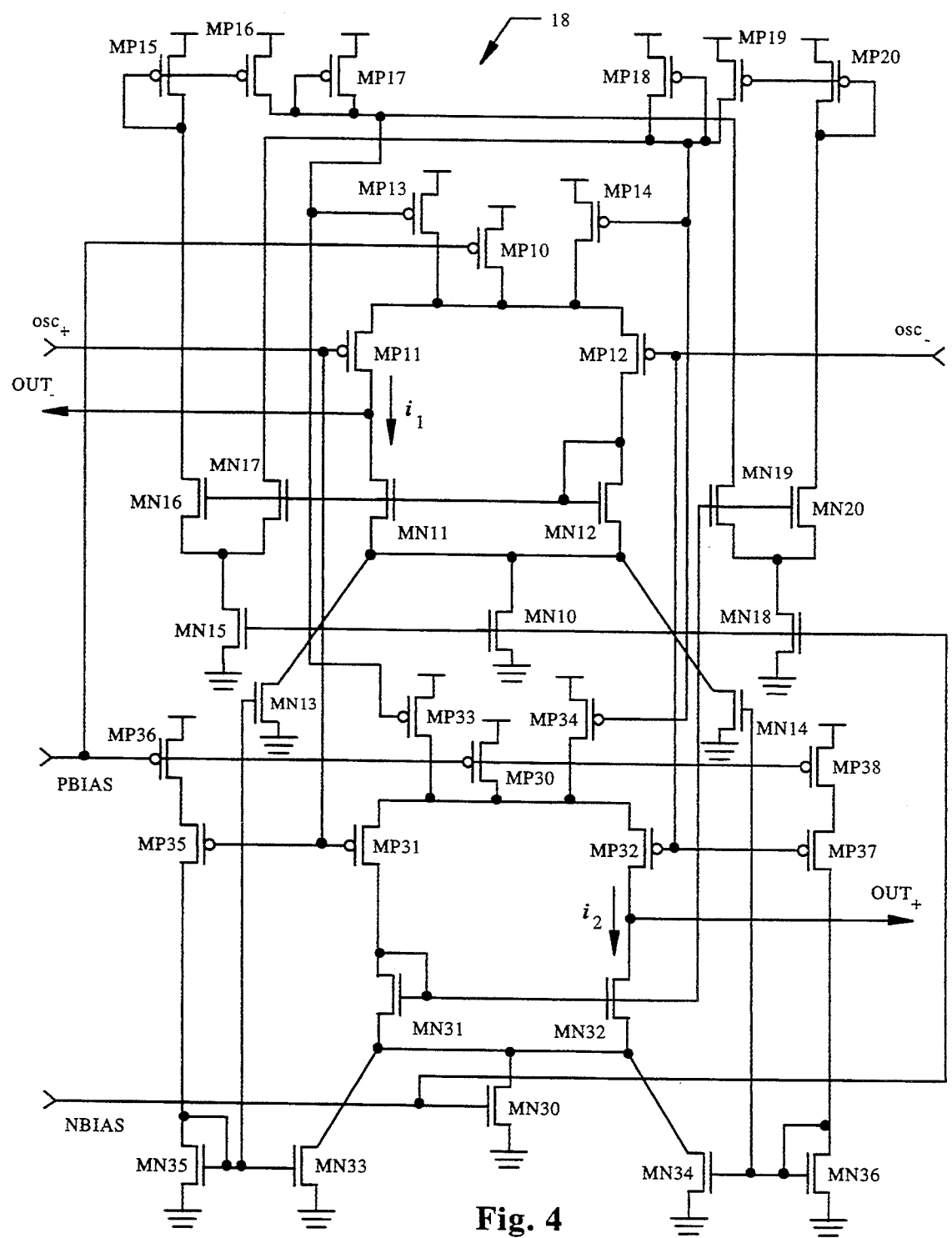
FIG. 4 is a schematic diagram of a preferred embodiment for the comparator depicted in FIG. 1.

Reference is now made to FIG. 4 which depicts an exemplary embodiment for the comparator 18 of FIG. 1. The PBIAS voltage is applied to the gates of transistors MP10, MP36, MP30, and MP38. The NBIAS voltage is applied to the gates of transistors MN30, MN18, MN10, and MN15. Osc$_+$ is applied to the gates of transistors MP11, MP35, and MP31. Osc is applied to the gates of MP12, MP32, and MP37. Transistors MP15, MP16, and MP17 calculate the difference between the current supplied by M11 (i1) and the current supplied by MP32 (i2). Output OUT$_+$ is taken from the drain junction of transistors MP32 and MN32 while OUT$_-$ is taken from the drain junction of transistors MP11 and MN11.

1.3 Phase Detector

Figure 5:
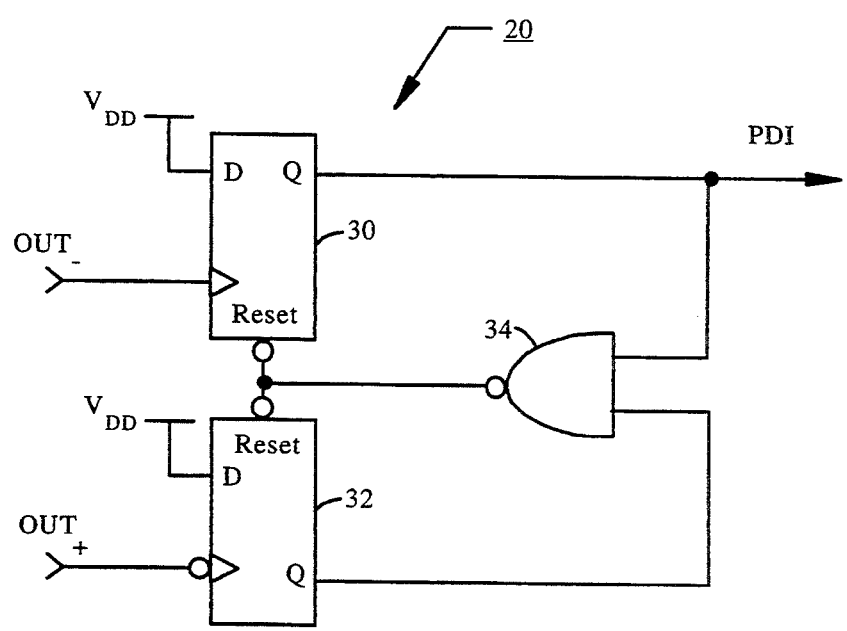
FIG. 5 is a schematic diagram of a preferred embodiment for the phase detectors depicted in FIG. 1; and, FIG. 6 is a schematic diagram of a preferred embodiment for the hysteresis latch depicted in FIG. 1.

Reference is now made to FIG. 5 which depicts an exemplary embodiment for the first and second phase detectors 20 and 22 depicted in FIG. 1. For simplicity, the first phase detector 20 is described with the differences in the second phase detector 22 being noted. Phase detector 20 comprises a first D-type flip-flop 30, a second D-type flip-flop 32 with an inverted clock input, and a NAND gate 34. Differential output signals OUT_ and OUT_+ from the comparator 18 are respectively coupled to the clock inputs on flip flops 30 and 32. The second phase detector 22 has the signals OUT_ and OUT_+ reversed on flip-flops 30 and 32 to detect a lag rather than a lead situation between OUT_ and OUT_+, as described in more detail hereinbelow. The D inputs of flip-flops 30 and 32 are coupled to the $V_{DD}$ rail of the power supply.

The Q outputs on flip-flops 30 and 32 are coupled to first and second inputs on the two input NAND gate 34. The Q output from flip-flop 30 also provides the phase detection error (PDI and PDII). The output of NAND gate 34 is coupled to an active low reset input on flip-flops 30 and 32. Accordingly, if the Q outputs of flip-flops 30 and 32 are simultaneously high due to overlap in clock signals OUT_+ and OUT_ (i.e. OUT_+ and OUT_ are not truly 180 degrees out of phase), then NAND gate 34 resets flip-flops 30 and 32 to a low output, The low output on PDI or PDII retards or advances osc_+ and osc_ in the triangle/sawtooth wave generator 16 to force OUT_+ and OUT_ 180 degrees out of phase. Thus in the case where 180 degree out of phase operation is not occurring, either PDI or PDII will be low depending on whether OUT_+ is leading or lagging OUT_. Specifically in the case of the first phase detector 20, a low PDI turns transistors MN8 and MP8 off in triangle/sawtooth wave generator 16 to compensate the differential output (OUT_ and OUT_+) 28. Likewise in the case of the second phase detector 22, a low PDII turns transistors MN6 and MP6 off in triangle/sawtooth wave generator 16.

1.4 Hysteresis Latch

Figure 6:
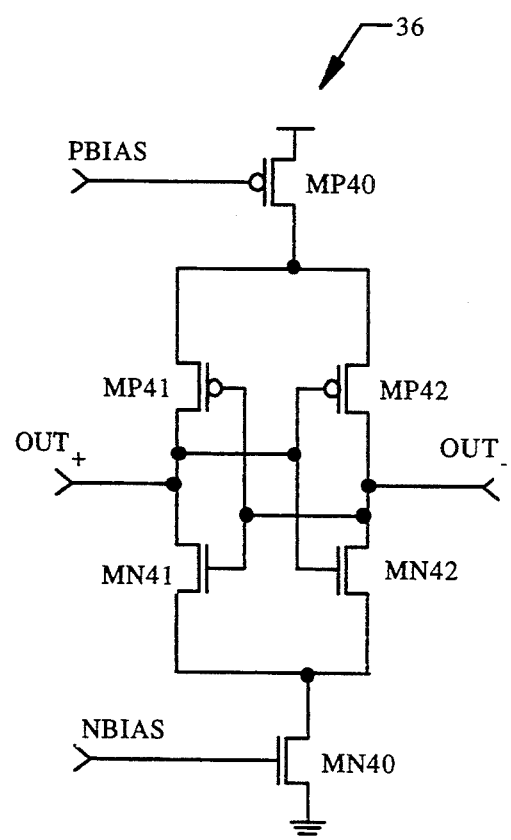

Reference is now made to FIG. 6 which depicts an exemplary embodiment for the hysteresis latch 36 in FIG. 1. OUT_+ from comparator 18 is coupled to the drains of MP41 and MN41 and to the gates of MP42 and MN42. Likewise, OUT_ is coupled to the drains of MP42 and MN42 and to the gates of MP41 and MN41. The gates of transistors MP40 and MN40 are respectively biased by PBIAS and NBIAS so that at high currents, a minimum peak to peak swing between OUT_+ and OUT_ is maintained. In the preferred embodiment, the gates of transistors MP40 and MN40 are respectively biased to maintain a minimum peak to peak swing of substantially one volt.

2. Conclusion

Although the Detailed Description of the invention has been directed to a certain exemplary embodiment, various modifications of this embodiment, as well as alternative embodiments, will be suggested to those skilled in the art. The invention has general applicability and encompasses any modifications or alternative embodiments that fall within the scope of the Claims.

What is claimed is:

1. A voltage controlled oscillator comprising:
(a) a triangle wave generator having a plurality of inputs and a differential output, a first and a second input of the plurality of inputs being coupled to a first and a second bias voltage;
(b) a comparator having a differential input and a differential output, the differential input being coupled to the differential output from the triangle wave generator;
(c) a first phase detector having first and second inputs and an output, the first and second inputs being coupled to the differential output from the comparator, the output of the first phase detector being coupled to a third input of the plurality of inputs on the triangle wave generator; and,
(d) a second phase detector having first and second inputs and an output, the first and second inputs being crossed-coupled with respect to that of the first phase detector, to the differential output from the comparator, the output being coupled to a fourth input of the plurality of inputs on the triangle wave generator.

2. A voltage controlled oscillator as recited in claim 1 further comprising a hysteresis latch coupled across the differential output of the comparator.

3. A voltage controlled oscillator as recited in claim 2 wherein the hysteresis latch maintains a minimum peak to peak swing on the differential output of the triangle wave generator of substantially one volt.

4. A voltage controlled oscillator comprising:
(a) triangle wave generator means for generating a differential triangle wave output;
(b) comparator means, coupled to the triangle wave generator means, for generating a differential square wave;
(c) first phase detector means, coupled between the comparator means and the triangle wave generator means, for detecting a phase lead error with respect to the differential square wave on the comparator;
(d) second phase detector means, coupled between the comparator means and the triangle wave generator means in opposing relation with respect to the first phase detector means, for detecting a phase lag error with respect to the differential square wave on the comparator.

5. A voltage controlled oscillator as recited in claim 4 further comprising hysteresis means coupled across the comparator means, for inducing hysteresis in the differential triangle wave output.

6. A voltage controlled oscillator as recited in claim 5 wherein the hysteresis means induces a minimum peak to peak swing of substantially one volt.

7. A method of generating a differential oscillator signal comprising the steps of:
(a) generating a differential triangle wave output;
(b) generating a differential square wave in response to the triangle wave output;
(c) detecting a phase lead error with respect to the differential square wave;
(d) detecting a phase lag error with respect to the differential square wave on the comparator; and,
(e) correcting step (a) in response to steps (c) and (d) so that the differential triangle wave output is substantially 180 degrees out of phase.

8. A method as recited in claim 7 further comprising the step (f) of inducing lhysteresis in the differential triangle wave output.

* * * * *